United States Patent
Geng et al.

(10) Patent No.: US 10,917,055 B2
(45) Date of Patent: Feb. 9, 2021

(54) WIDE BAND BUFFER WITH DC LEVEL SHIFT AND BANDWIDTH EXTENSION FOR WIRED DATA COMMUNICATION

(71) Applicant: NXP B.V., Eindhoven (NL)

(72) Inventors: Xueyang Geng, Chandler, AZ (US); Siamak Delshadpour, Chandler, AZ (US); Soon-Gil Jung, Cupertino, CA (US); Ahmad Yazdi, San Jose, CA (US)

(73) Assignee: NXP B.V., Eindhoven (NL)

( * ) Notice: Subject to any disclaimer, the term of this patent is extended or adjusted under 35 U.S.C. 154(b) by 113 days.

(21) Appl. No.: 16/184,921

(22) Filed: Nov. 8, 2018

(65) Prior Publication Data

US 2020/0153395 A1    May 14, 2020

(51) Int. Cl.
| | |
|---|---|
| *H03F 3/45* | (2006.01) |
| *H03F 3/19* | (2006.01) |
| *H03K 5/003* | (2006.01) |
| *H03D 7/14* | (2006.01) |

(52) U.S. Cl.
CPC ............ *H03F 3/19* (2013.01); *H03D 7/1433* (2013.01); *H03D 7/1458* (2013.01); *H03K 5/003* (2013.01); *H03F 3/45071* (2013.01); *H03F 3/45085* (2013.01)

(58) Field of Classification Search
CPC ...... H03F 3/19; H03F 3/45085; H03F 1/3211; H03F 3/45071; H03F 3/45183; H03F 3/45179; H03F 3/45192; H03D 7/1458; H03D 7/1433; H03K 5/003
USPC .......................................... 330/252, 253, 261
See application file for complete search history.

(56) References Cited

U.S. PATENT DOCUMENTS

| | | | |
|---|---|---|---|
| 4,491,802 A | 1/1985 | Uchida et al. | |
| 5,337,010 A | 8/1994 | Nishiyama | |
| 5,432,477 A | 7/1995 | Nishiyama et al. | |
| 5,703,912 A * | 12/1997 | Wang | H03D 7/1441 327/141 |
| 5,939,922 A * | 8/1999 | Umeda | H03K 19/01806 326/68 |
| 6,437,628 B1 * | 8/2002 | Davenport | H03K 19/018514 327/112 |
| 6,798,290 B2 * | 9/2004 | Groe | H03F 3/45085 327/103 |
| 7,400,196 B2 | 7/2008 | Wyatt | |

(Continued)

*Primary Examiner* — Khanh V Nguyen (57) ABSTRACT

A wide band communications circuit buffer can include a pair of NPN bipolar transistor emitter followers deployed as a voltage buffer and disposed at inputs before and outputs after an equalization module, and a pair of diode connected NPN transistors deployed as a level shifter and disposed following the emitter followers before an output of the wide band driver to keep an output level at the output of the wide band buffer close to a desired level. Resistors connected between emitters and a $V_{EE}$ terminal can be used to further adjust the DC level. An LC tank filter can be provided between emitters of the voltage buffer components and the circuit's outputs to pass and boost high frequency signals provided to next stage components. The wide band buffer is, inter alia, appropriate for use in providing a DC level shift function as used in wired data communication systems circuitry.

16 Claims, 4 Drawing Sheets

(56) References Cited

U.S. PATENT DOCUMENTS

| | | | | |
|---|---|---|---|---|
| 7,728,667 B2* | 6/2010 | Sugihara | ............... | H03F 1/3211 |
| | | | | 330/252 |
| 10,333,516 B2* | 6/2019 | Li | ......................... | H03K 17/78 |
| 2018/0342997 A1* | 11/2018 | Maeda | ...................... | H03F 3/04 |

* cited by examiner

FIG. 5

WIDE BAND BUFFER WITH DC LEVEL SHIFT AND BANDWIDTH EXTENSION FOR WIRED DATA COMMUNICATION

BACKGROUND

Wired communication refers to the transmission of data over a wire-based communication technology. In general, wired communications are considered to be the most stable of all types of communications services. Wide band wired data communication systems such as universal serial bus (USB), high-definition multimedia interface (HDMI), DisplayPort (DP), Peripheral Component Interconnect Express (PCIe), Thunderbolt, Converged Input Output (CIO) and any other high-speed communication applications often include stages of processing within their electronic circuitry.

Wide band data communications system circuitry can include several stages including modules to equalize, amplify and/or re-drive signals for its data channels. Usually one stage cannot provide enough gain or equalization. In such multi-stage systems, the use of intermediate buffers between each stage may be advantageous. Oftentimes, however, the buffer consumes even more power than the equalizer, amplifier and drivers, which makes a buffer block design more critical in the system, especially for use in low voltage (i.e., ~1.8V) systems. What are needed are improvements in wide bandwidth communication circuitry that reduce the power consumption and lead to more efficiency.

SUMMARY

The embodiments relate to wide band communications and to high speed digital or analog signal buffering in circuits engaged in the amplification and/or equalization of signals.

It is a aspect of the embodiments to provide a wide band buffer with DC level shift function for wired data communication systems such as USB, HDMI, DP, PCIe, Thunderbolt, CIO and any other high-speed communication applications requiring equalization, buffering and/or amplification.

In accordance with another aspect of the embodiments, a wide band buffer can be provided that includes a pair of NPN bipolar transistor emitter followers as a voltage buffer, and a pair of diode-connected NPN bipolar transistors as a level shifter following the emitter followers to keep the DC or common mode level of the output close to the input, or at whatever input common mode level is selected by design/needed for the next stage in the wide band communications circuit (e.g., the "desired level"). The desired level can be settable at an input level coming into a prior stage disposed before circuit inputs or an input level needed by a subsequent stage disposed after the circuit outputs.

It is also a aspect of the embodiments to provide resistors in the circuit that can be connected between a $V_{EE}$ terminal of the circuit and emitters of at least one of the pair of NPN bipolar transistor emitter followers ("emitter followers") and the pair of diode connected transistors ("bipolar transistors") to enable further adjustment of the DC voltage level (i.e., to obtain "fine adjustment") in order to optimize the circuit's performance. This aspect can be significant for low power supply voltage applications wherein trying to maintain the correct common mode voltage may be important.

It is also an aspect of the embodiments that LC tank filters can be provided in the circuit between emitters of the voltage buffer components and the driver's output for use to boost the signal bandwidth for high-speed communication application.

It is an additional aspect of the embodiments to provide a wide band buffer with a built in level shifter that can level shift signals to meet the input and output requirement of a following and/or previous stage respectively. This arrangement is significant for low power supply voltage applications because modern low voltage power supplies typically allow only one stack of current mode transistors. There is generally little headroom in low voltage circuits for the second stage without having to shift up the signal level.

It is also an aspect of the embodiments to provide a buffer that can separate the high frequency and low frequency path and combines them together at the output. The high frequency signals generally have more loss than low frequency signals in a communication channel. The high frequency and low frequency signal component separation makes it easier for the system to boost the high frequency signal component while keeping the low frequency signal component unchanged.

It is also an aspect of the embodiments to provide a wide band wired communication circuit that includes a continuous time linear equalizer (CTLE) buffer disposed along a circuit input before a CTLE to set a DC level for input signals and isolate the circuit input from CTLE inputs, and a TX PreDriver disposed before a TX Driver after the CTLE to isolate the TX Driver from the CTLE at CTLE outputs and maintain the DC level of input signals for a TX Driver input.

It is also an aspect of the embodiments to provide a wide band wired communication circuit that includes a CTLE buffer disposed along an input before a CTLE to set a DC level for input signals and isolate the circuit input from CTLE inputs, and a TX PreDriver disposed before a TX Driver after the CTLE to isolate the TX Driver from the CTLE and maintain the DC level of the input signals for the TX Driver at TX Driver inputs and that includes a pair of emitter followers Q1 and Q2 at the input to buffer the input signals.

It is also an aspect of the embodiments to provide a wide band wired communication circuit that includes a CTLE buffer disposed along an input before a CTLE to set a DC level for input signals and isolate the input from the CTLE inputs, and a TX PreDriver disposed before a TX Driver after the CTLE at CTLE outputs to isolate the TX Driver from the CTLE and maintain the DC level of the input signals for TX Driver inputs that includes a pair of emitter followers Q1 and Q2 at the input to buffer the input signals and that includes a pair of bipolar transistors Q3 and Q4 to shift common mode voltage levels from an output of the emitter followers Q1 and Q2 to a common mode voltage level needed by the next state component or selected by design for a next stage component, which can be collectively referred to as a "desired level".

It is also an aspect of the embodiments to provide a wide band wired communication circuit that includes a CTLE buffer disposed along an input before a CTLE to set a DC level for input signals and isolate the input from the CTLE inputs, and a TX PreDriver disposed before a TX Driver after the CTLE at CTLE outputs to isolate the TX Driver from the CTLE and maintain the DC level of the input signals for a TX Driver input that includes a pair of emitter followers Q1 and Q2 at the input to buffer the input signals, that includes a pair of bipolar transistors Q3 and Q4 to shift common mode voltage levels from an output of the emitter followers Q1 and Q2 to a desired level, i.e., the common mode voltage needed by the next stage component or selected by design for a next stage component, and that includes at least one of a resistor, R1, disposed between a $V_{EE}$ terminal and a Q1 emitter, a resistor, R2, disposed between the $V_{EE}$ terminal and a Q2 emitter, a resistor, R3, disposed between the $V_{EE}$ terminal and a Q3 emitter, and a resistor, R4, disposed between the $V_{EE}$ terminal and a Q4 emitter to further adjust (i.e., "fine adjust") the common mode voltage of output signals from the circuit, wherein the common mode voltage of Vout, $V_{cm\_out} \approx V_{cm_{in}} - R_1 I_E + R_3 I_C$, supposing $V_{BE3} = V_{BE1}$ and $V_{BE4} = V_{BE2}$ if emitter area ratio $A_1/A_3$ and $A_2/A_4$, is equal to the emitter current ratio $I_E/I_C$.

It is also an aspect of the embodiments to provide a wide band wired communication circuit that includes a CTLE buffer disposed along an input before a CTLE to set a DC level for input signals and isolate the input from the CTLE inputs, and a TX PreDriver disposed before a TX Driver after the CTLE at CTLE outputs to isolate the TX Driver from the CTLE and maintain the DC level of the input signals for a TX Driver input that includes a pair of emitter followers Q1 and Q2 at the input to buffer the input signals, that includes a pair of bipolar transistors Q3 and Q4 to shift common mode voltage levels from an output of the emitter followers Q1 and Q2 to a desired level, i.e., the common mode voltage needed by or selected by design for a next stage component, and LC tank circuit disposed between emitters of Q1 and Q2 and the circuit's outputs to pass and boost high frequency signals to a next stage component.

It is also an aspect of the embodiments to provide a wide band wired communication circuit that includes a CTLE buffer disposed along an input before a CTLE to set a DC level for input signals and isolate the input from the CTLE inputs, and a TX PreDriver disposed before a TX Driver after the CTLE at CTLE outputs to isolate the TX Driver from the CTLE and maintain the DC level of the input signals for a TX Driver input that includes a pair of emitter followers Q1 and Q2 at the input to buffer the input signals, that includes a pair of bipolar transistors Q3 and Q4 to shift common mode voltage levels from an output of the emitter followers Q1 and Q2 to a common mode voltage needed by a next stage component, at least one of a resistor, R1, disposed between a $V_{EE}$ terminal and an emitter of Q1, a resistor, R2, disposed between the $V_{EE}$ terminal and an emitter of Q2, a resistor, R3, disposed the $V_{EE}$ terminal and an emitter of Q3, and a resistor, R4, disposed the $V_{EE}$ terminal and an emitter of Q4 to further adjust the common mode voltage of output signals from the circuit, wherein the common mode voltage of Vout, $V_{cm\_out} \approx V_{cm_{in}} - R_1 I_E + R_3 I_C$, supposing $V_{BE3} = V_{BE1}$ and $V_{BE4} = V_{BE2}$ if the emitter area ratio $A_1/A_3$ and $A_2/A_4$, is equal to the emitter current ratio $I_E/I_C$, and LC tank circuit connected between emitters of Q1 and Q2 and the circuit's outputs to pass and boost high frequency signals to a next stage component.

These and other aspects in accordance with embodiments will become apparent from the following detailed description, taken in conjunction with the accompanying drawings, illustrated by way of example of the principles of the embodiments.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended Figs. could be arranged and designed in a wide variety of different configurations. Thus, the following more detailed description of various embodiments, as represented in the Figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the embodiments is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
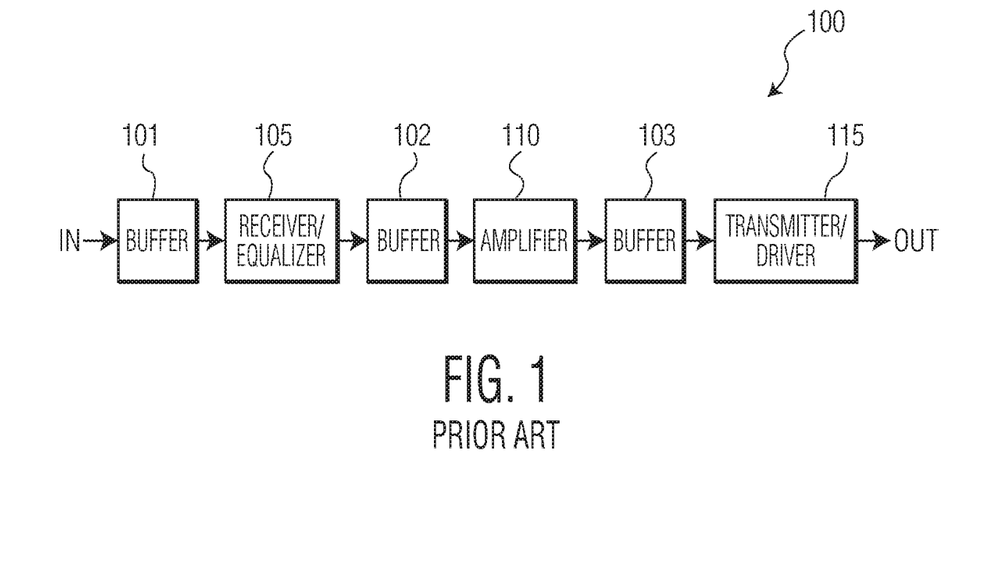
FIG. 1, labeled as prior art, depicts a wiring diagram of a generally known communication channel.

FIG. 1, labeled as "prior art", illustrates a typical architecture of a high-speed wide band data communication system 100, typically provided in the form of a circuit in a microchip, incorporating buffers 101, 102, 103 therein, but preferably the buffers would be modified with features in accordance with the present embodiments. Usually such a system includes a receiver/equalizer 105, amplifier 110, such as a programmable gain amplifier (PGA), and a transmitter/driver 115. Each of these blocks can be provided as one stage or multiple stages. Without buffers included in the circuit, as shown with buffer 101 disposed (i.e., "connected") before receiver/equalizer stage 105, or buffer 102 and buffer 103 as respectively shown disposed in-between amplifier 110 and transmitter/driver 115 stages, the stages may less effectively provide their intended functions (e.g., amplification and transmission) because of loading experienced from the following stage. For example, without buffers 102, in between receiver/equalizer stage 105 and amplifier 110, and buffer 103 in between amplifier 110 and transmitter/driver 115, the output common mode voltage of the previous stage may not meet the requirements of a following stage. Most times, the system may have buffers (i.e., 102, 103) connected in between each stage (i.e., 105, 110, 115) of a high-speed wide band data communication system 100 as depicted in FIG. 1. As stated in the background, however, intermediate buffers used between each stage in the past have proven to consume more power than the equalizer, amplifier and drivers themselves, which makes a better, more efficient, design of a buffer block more critical for wide band, high-speed communications systems. The present inventors now disclose such improvements for wide bandwidth communication circuitry wherefrom power consumption can be reduced leading to more efficiency.

Figure 2:
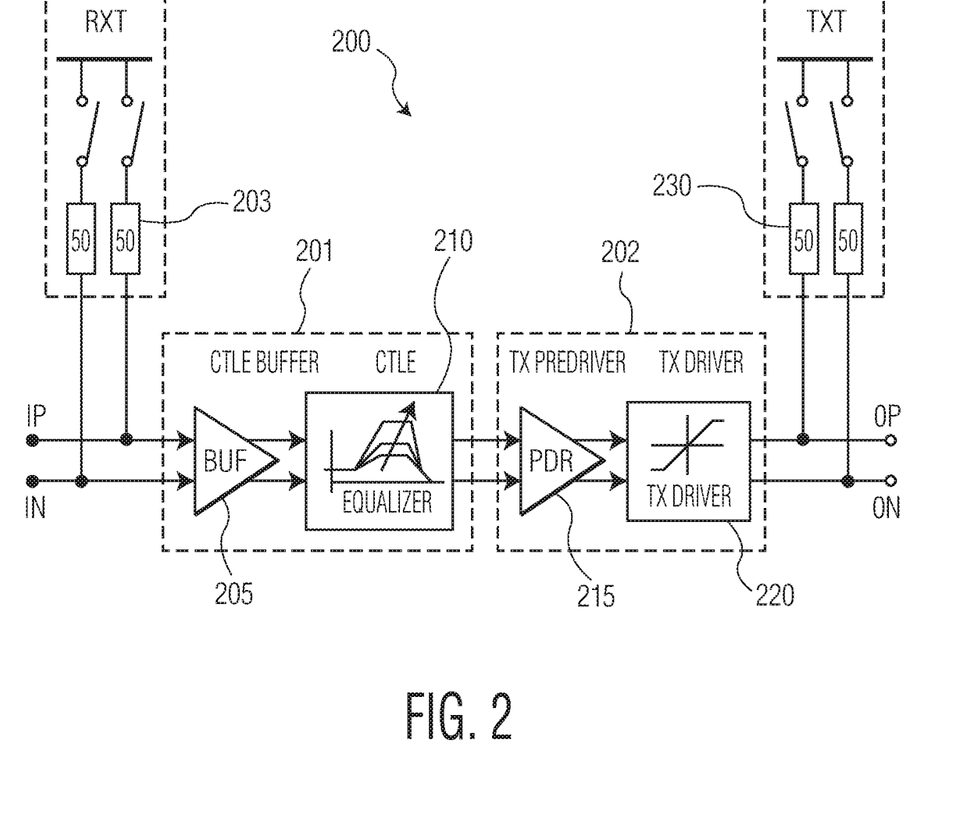
FIG. 2 depicts a wiring diagram of a linear re-driver with buffers provided in accordance with an embodiment.

Illustrated in FIG. 2 is a wiring diagram of a wide band communications system 200, incorporating the embodiments. A high frequency linear driver circuit such as the wide band communications system 200 illustrated in FIG. 2 can include an equalization block 201 and a transmission block 202, which can be used in, for example, USB/HDMI/DP/Thunderbolt/PCIe/CIO data communication paths. An equalization block 201 can include a CTLE 210 (continuous-time-linear-equalizer), while a transmission block 202 can include a TX driver 220 (transmitter driver) with or without a PGA, depending on the actual implementation. The TX Driver 220 can be a differential pair of transistors adapted to drive a termination load disposed at a TX Driver output. Output from the TX driver 220 typically drives about a 50-Ohm load termination 230 at its outputs, which is shown as a Transmit Termination (TXT) within the dashed box positioned after the transmission block 202. A similar 50-Ohm load 203 can also be found to affect the inputs of the equalization block 201, which is shown as a Receive Termination (RXT) within the dashed box positioned before the equalization block 201. A CTLE buffer 205 (BUF) provided as designed in accordance with the embodiments can be disposed inline before the CTLE 210 as well as for TX pre-driver 215 (PDR) disposed inline before the TX driver 220, after the CTLE 210, in the wide band communications system 200.

TX driver 220 can be provided as a simple differential pair to drive what is typically a 50-Ohm load termination (see FIG. 2, 50-Ohm load termination 230). But this can call for the differential pair transistors to be relatively large devices. Furthermore, parasitic capacitors when provided at the TX output can load CTLE 210 and impact its performance. So an improved TX pre-driver 215 is needed to operate as a redriver circuit and to isolate CTLE 210 from TX driver 220 and also drive the long routing path from CTLE 210 to TX driver 220. Buffers used in such a circuit can provide a desired DC level for TX driver input, which can be a key factor for "Low Supply Voltage" due to headroom challenges to achieve high linearity. High linearity is often an important specification parameter for a linear redriver. The "desired" DC level for TX driver input can be at the DC or common mode level of the output from a prior stage closest to the input, or at whatever input level is selected by design or is needed for the next stage in the wide band communications circuit (e.g., the "desired level"). Although circuit design requirements can dictate variations for what the desired level after the emitter followers may be, it can commonly be determined that the output be kept at or above the DC or input common mode level (e.g., the "input") entering the wide band buffer. The desired level therefore can be settable at a level for inputs coming into a prior stage disposed before a circuit's inputs or at a level needed by a subsequent stage disposed after outputs of the circuit.

Figure 3:
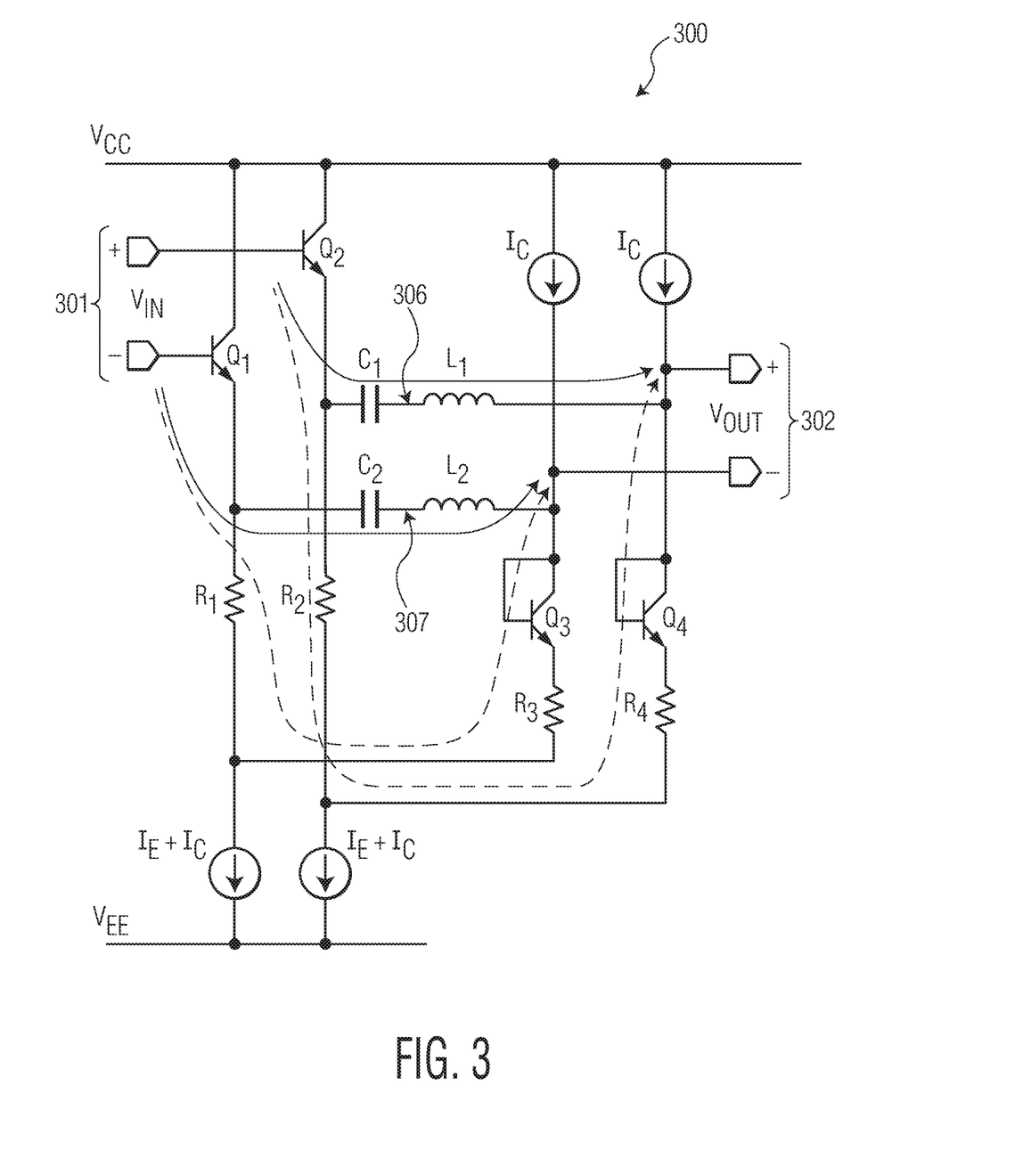
FIG. 3 depicts a wide band buffer in accordance with an embodiment.

A detailed diagram for wide band communication circuit 300 including wideband buffer capabilities that can be provided in accordance with the embodiments is depicted in FIG. 3. The architecture of this wide band communication circuit 300 can be used to provide the signal buffering and level shift functions desirable for wide band communications systems, including those depending on low voltage systems. It can also be used to boost the high frequency gain of a communications circuit to expand the bandwidth of signals. It can be used to fulfill the predriver and redriver requirements described with respect to FIG. 2. Using bipolar transistors, which can be provided in BiCMOS technology, the input stage typically needs a certain DC level (e.g., set at the DC common mode voltage level, or needed by design, "desired level"). To achieve this, use of a buffer before CTLE 210, as shown in FIG. 2, is desirable to isolate incoming signals from inputs of the CTLE 210 and set its DC level.

As shown in the schematic diagram for the wide band communications circuit 300, each node (Positive & Negative) has two signal paths from input 301 to output 302 for a signal to pass through. A high-speed path (i.e., high frequency) is shown in a solid line, while a low speed path (low frequency) is shown as a dashed line. The wide band communications circuit 300 can include a pair of emitter followers Q1 and Q2 representing the CTLE buffer 210. They are the major devices provided to buffer signal going into the input 301. CTLE buffer 205 can serve as a wide band buffer adapted to provide signal buffering and level shift functions by including a pair of emitter follower transistors Q1 and Q2 at CTLE inputs to buffer the input signals. A pair of bipolar transistors Q3 and Q4 can be used to shift the common mode voltage levels from the output of emitter follower Q1 and Q2 to the common mode voltage that the next stage needs. R1 and R2 along with R3 and R4 can be connected in the circuit as shown to further adjust the common mode voltage of output signals from the output 302. A common mode voltage of $V_{out}$, $V_{cm\_out} \approx V_{cm_{in}} - R_1 I_E + R_3 I_C$, is achievable supposing $V_{BE3} = V_{BE1}$ and $V_{BE4} = V_{BE2}$, if the emitter area ratio $A_1/A_3$ and $A_2/A_4$ is equal to the emitter current ratio $I_E/I_C$. The common mode voltage that the next state might need may often be to keep the DC or common mode level of the output close to the input, or it can be to maintain whatever input common mode level is selected by design/needed for the next stage in the wide band communications circuit (e.g., the "desired level"). Although circuit design requirements can dictate variations for what the desired level after the emitter followers should be, it will commonly be determined that the output be kept at or above the DC or input common mode level (e.g., the "input") entering the wide band buffer.

A pair of LC tank circuits 306, 307 can be included in the circuit as shown and can be used to pass and boost the high frequency signals to the next stage. LC tanks are ideally selected to be large enough to pass the signal at as low a frequency as possible while also blocking the DC voltage. The positive and negative low frequency signals blocked by the LC tanks, including the DC signal, can be passed through paths Q1-R1-R3-Q3 and Q2-R2-R4-Q4, respectively. A corner frequency between the high frequency path and the low frequency path would ideally match each other and can be adjusted carefully to have a flattest frequency response. LC tanks can also be chosen to extend the signal bandwidth, while minimizing the peaking gain so as not to impact the frequency response of the whole channel.

Figure 4:
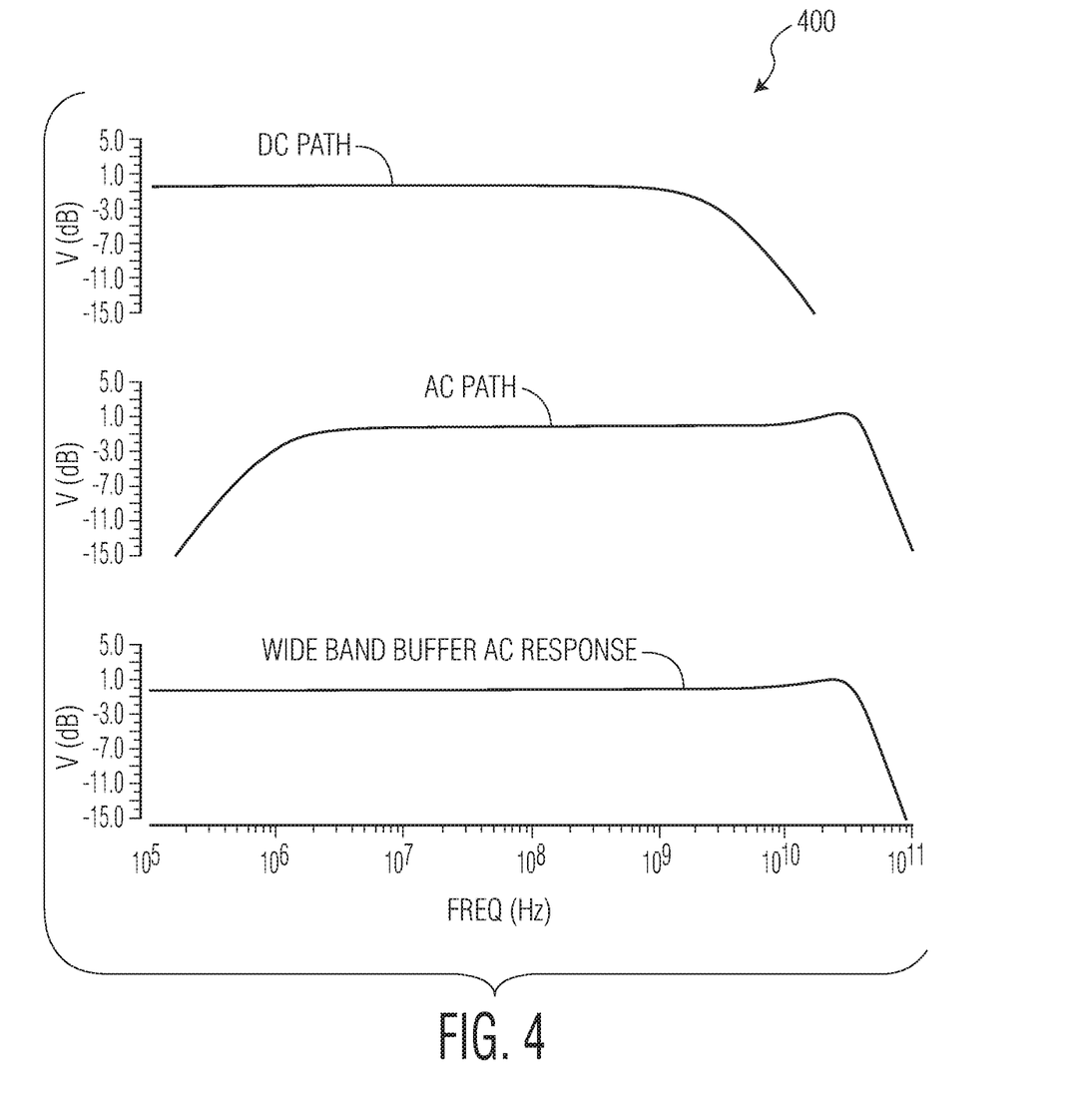
FIG. 4 depicts a chart of the AC response signals for a low speed, high speed and complete buffer in accordance with an embodiment.

Referring to FIG. 4, a graph 400 is provided that depicts the AC responses of a low speed signal, a high-speed signal and a signal impacted by a complete buffer. Also depicted are high speed and low speed signal gain, and the buffered signal gain, which is the total of high speed and low speed gain. As can be seen in the graph 400, a wideband buffer response can be achieved by adding the high speed and low speed signal paths.

Figure 5:
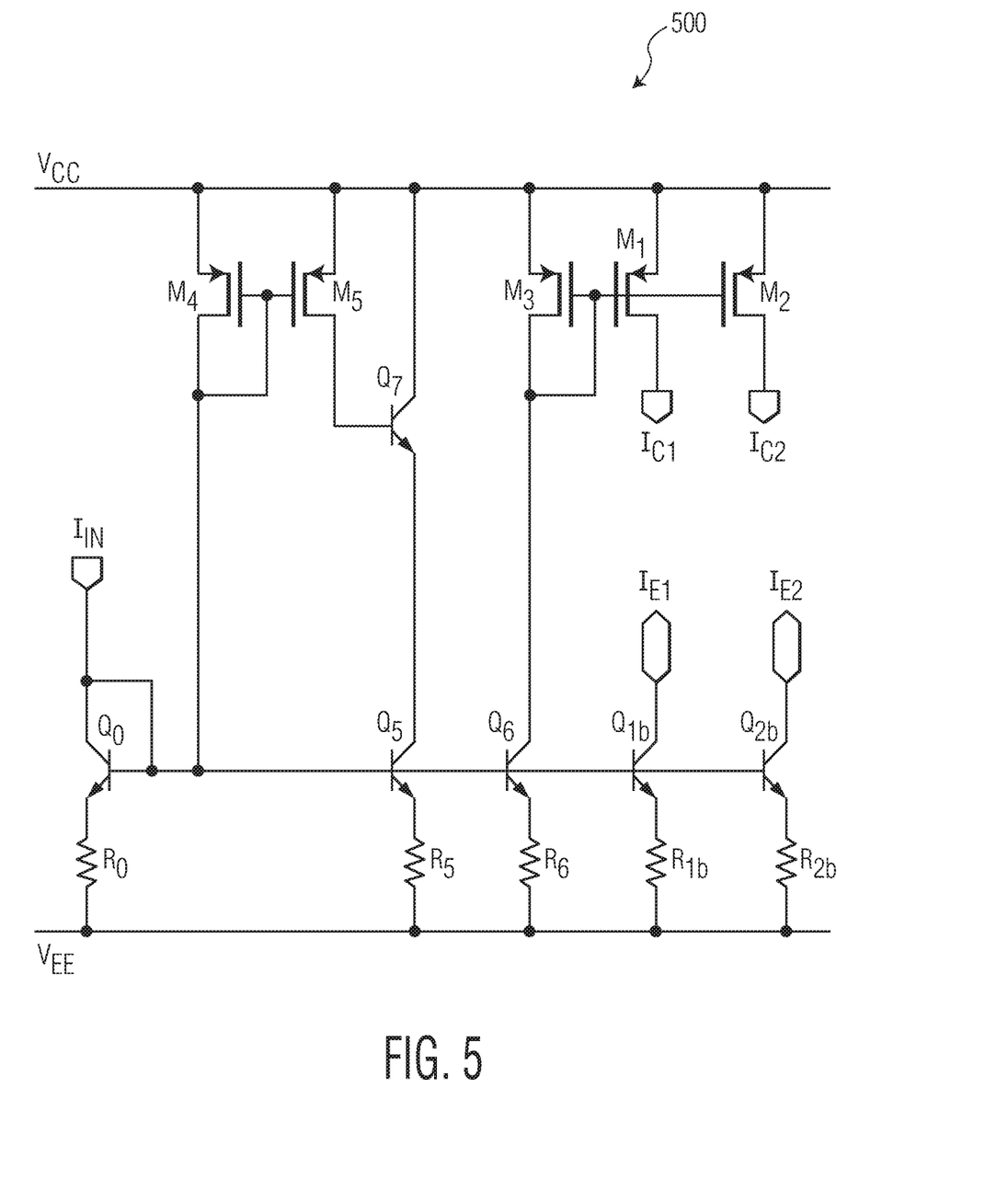
FIG. 5 depicts an alternate embodiment of a bias circuit for a wide band buffer as part of a wide band communication system.

FIG. 5 depicts an alternate embodiment of a bias circuit 500 for a wide band buffer as part of a wide band communication system, which is configured to maintain A1/A3=A2/A4=$I_E/I_C$. There are many ways to pick the size of the bipolar and MOS transistors. One example can be to pick M1=M2=M3 and $$Q_6 = \frac{A_3}{A_1} \times Q_{1b} = \frac{A_4}{A_2} \times Q_{2b}$$

to maintain $V_{BE3}=V_{BE1}$ and $V_{BE4}=V_{BE2}$. $Q_0$ is the input transistor of the current mirror. Q5, Q7, M4 and M5 can compose a base current compensation circuit to compensate the base current of the current mirror to minimize the current mismatch. Degeneration resistors can be chosen with the right ratio of the emitter area of bipolar transistor, that is $$\frac{1}{R_0}:\frac{1}{R_5}:\frac{1}{R_6}:\frac{1}{R_{1b}}:\frac{1}{R_{2b}} = Q_0:Q_5:Q_6:Q_{1b}:Q_{2b}.$$

Accordingly, the embodiments described herein can provide a voltage buffer for wide band high frequency signals, can separate high frequency and low frequency component paths, can boost high frequency gain by series inductor peaking, can pass a low frequency component without amplification or attenuation, can keep output common mode voltage at or near the same level as the input, can control output common mode voltage in an accurate manner, and works in voltage (e.g., 1.8V low) power supplies.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It can also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A wide band communication circuit, comprising:
   a pair of NPN bipolar transistor emitter followers deployed as a voltage buffer and disposed at a set of inputs before an equalization module; and
   a pair of diode connected NPN bipolar transistors deployed as a level shifter and disposed following the pair of NPN bipolar transistor emitter followers at a set of outputs to maintain an output level at a desired level.

2. The wide band communication circuit of claim 1, further comprising a resistor disposed between a VEE terminal and emitters of at least one of the pair of NPN bipolar transistor emitter followers and the pair of diode connected NPN transistors to enable further adjustment of the desired level.

3. The wide band communication circuit of claim 1, further comprising an LC tank filter disposed between emitters of the pair of NPN bipolar transistor emitter followers and the set of outputs to boost signal bandwidth for high-speed communication applications.

4. The wide band communication circuit of claim 1, wherein the desired level is settable at an input level coming into a prior stage disposed before the voltage buffer.

5. The wide band communication circuit of claim 1, wherein the desired level is settable to an input level needed by a subsequent stage disposed after the voltage buffer.

6. The wide band communication circuit of claim 1, further comprising:
   a high-speed circuit path configured to pass high-frequencies; and
   a low-speed circuit path configured to pass low-frequencies;
   wherein the high-speed path includes a tank circuit including a capacitor and an inductor; and
   wherein the low-speed path include a resistor.

7. The wide band communication circuit of claim 6:
   wherein the high-speed circuit path is configured to block low-frequencies; and
   wherein the low-speed circuit path is configured to block high-frequencies.

8. A wide band communication circuit, comprising:
   a CTLE buffer connected between a circuit input and a CTLE to set a DC level for input signals to CTLE inputs of the CTLE and to isolate the circuit input from the CTLE inputs; and
   a TX PreDriver connected before a TX Driver and after the CTLE at CTLE outputs to isolate the TX Driver from the CTLE and maintain the DC level of the input signals for a TX Driver input.

9. The wide band communication circuit of claim 8, wherein the CTLE buffer comprises bipolar transistors.

10. The wide band communication circuit of claim 8, wherein the TX Driver is a differential pair adapted to drive a termination load disposed at a TX Driver output.

11. The wide band communication circuit of claim 10, further comprising parasitic capacitors disposed at the TX Driver output in association with the termination load disposed at the TX Driver output.

12. The wide band communication circuit of claim 8, wherein the CTLE buffer is a wide band buffer adapted to provide signal buffering and level shift functions by including a pair of emitter follower transistors Q1 and Q2 at the CTLE inputs to buffer the input signals.

13. The wide band communication circuit of claim 12, further comprising a pair of bipolar transistors Q3 and Q4 to shift common mode voltage levels from outputs of the pair of emitter follower transistors Q1 and Q2 to a common mode voltage needed by a next stage component.

14. The wide band communication circuit of claim 13, further comprising at least one of an R1 disposed between a $V_{EE}$ terminal and a Q1 emitter, an R2 disposed between the $V_{EE}$ terminal and a Q2 emitter, an R3 disposed the $V_{EE}$ terminal and a Q3 emitter, and an R4 disposed the $V_{EE}$ terminal and a Q4 emitter to further adjust the common mode voltage, wherein the common mode voltage is Vout, $V_{cm\_out} \approx V_{cm_{in}} - R_1 I_E + R_3 I_C$, supposing $V_{BE3} = V_{BE1}$ and $V_{BE4} = V_{BE2}$ if an emitter area ratio $A_1/A_3$ and $A_2/A_4$, is equal to an emitter current ratio $I_E/I_C$.

15. The wide band communication circuit of claim 14, further comprising a pair of LC tank circuits disposed between emitters of Q1 and Q2 and the CTLE outputs to pass and boost signals to a next stage component.

16. The wide band communication circuit of claim 15, wherein the pair of LC tank circuits is adapted to block positive and negative low frequency signals, including the DC level, passing through paths Q1-R1-R3-Q3 and Q2-R2-R4-Q4, respectively.

* * * * *